United States Patent
Li et al.

[11] Patent Number: 5,940,415
[45] Date of Patent: Aug. 17, 1999

[54] ERROR TOLERANT ADDRESSING SYSTEM AND METHOD FOR NOISY ATM LINKS

[75] Inventors: Kwok-Leung Li, Silver Spring; Yung-Lung Ho, Rockville, both of Md.

[73] Assignee: Lucent Technologies Inc., Murray Hill, N.J.

[21] Appl. No.: 08/710,296

[22] Filed: Sep. 17, 1996

[51] Int. Cl.⁶ .......................... H03M 13/00; H04L 12/28
[52] U.S. Cl. .................... 371/37.1; 370/353; 370/397
[58] Field of Search ............... 371/30, 37.1, 37.5, 371/37.8, 37.01, 37.4; 370/244, 248, 218, 905, 395, 397, 353; 200/202, 205, 206, 207, 221; 711/200, 201, 202, 205

[56] References Cited

U.S. PATENT DOCUMENTS

| | | | |
|---|---|---|---|
| 5,144,619 | 9/1992 | Munter | 370/353 |
| 5,323,389 | 6/1994 | Bitz et al. | 370/397 |
| 5,440,552 | 8/1995 | Sugita | 370/395 |
| 5,568,651 | 10/1996 | Medina et al. | 395/894 |
| 5,610,921 | 3/1997 | Christensen | 370/395 |

*Primary Examiner*—Trinh L. Tu
*Attorney, Agent, or Firm*—Sixbey, Friedman Leedom & Ferguson, PC; Daniel W. Sixbey; Eric J. Robinson

[57] ABSTRACT

A system and method for reliable transmission of information using asynchronous transfer mode (ATM) through a noisy transmission path such as a wireless or satellite transmission link. To efficiently adapt ATM to such wireless links requires the ability to discern ATM cell addresses in a high noise environment. The system and method provides multiple redundant addressing to reduce or eliminate misrouting of ATM cells transferred through such a noisy transmission link. The multiple redundancy addressing realizes multiple virtual circuits to the same destination. The multiple redundant addresses for the circuits are within the error space of a principal address used for actual transmission. Thus, the most probable error patterns occurring in the ATM address field will change the principal address to a redundant address to the same destination, thus avoiding misrouting of the ATM cell.

22 Claims, 4 Drawing Sheets

ERROR TOLERANT ADDRESSING SYSTEM AND METHOD FOR NOISY ATM LINKS

FIELD OF THE INVENTION

The present invention relates to a system and method for reliable transmission of information using asynchronous transfer mode (ATM) through a noisy transmission path and more particularly to such a system and method in which multiple redundant addressing is used to reduce or eliminate misrouting of ATM cells transferred through such a noisy transmission link.

BACKGROUND OF THE PRESENT INVENTION

Recently, the utilization of asynchronous transfer mode, or ATM, technology with wide area networks, or WANs, has become increasingly popular. However, the use of ATM in wireless and satellite dependent networks has been limited, primarily due to noise considerations. ATM was originally designed for use in an optical fiber environment with bit-error-rates (BER) of $10^{-11}$ or less. As the BER increases to approximately $10^{-2}$, which is likely in radio applications including wireless and satellite applications, uncorrectable errors in the ATM cell header (i.e. errors greater than 1 bit) can prevent reliable delivery of the ATM cells.

A typical ATM packet, or cell, is shown in FIG. 1A. As seen in FIG. 1A, an ATM cell 100 includes a header portion 102 and a payload portion 104. Header portion 102 includes 5 bytes 106, 108, 110, 112 and 114 that contain routing and control information, while payload portion 104 includes 48 bytes of user data. Virtual circuits in an ATM link are identified by a header address contained within header portion 102. This header address may be 24 or 28 bits depending on whether the link is a user-network interface (UNI) or network-network interface (NNI), respectively. FIG. 1B shows header portion 102 in more detail, including the 5 bytes 106, 108, 110, 112 and 114 that make up header portion 102. In an NNI, the header address 120 includes the first 28 bits of header portion 102, while in a UNI, the header address includes 24 bits 122 as shown in FIG. 1B.

A conventional ATM cell switching method is described in connection with FIG. 2. It is important to note that in the conventional switching method a particular ATM header address, such as header address 120 or 122 shown in FIG. 1B, is only valid for a given link. For example, referring to FIG. 2, a cell sent by user 210 is transferred through two ATM switches 212 and 214 to an ATM network shown generally at 216. As the cell traverses through links 218, 220 and 222, it may have three different header addresses—one for each link. As long as each switch 212 and 214 recognizes the input address of the incoming cell, and routes it to the appropriate output port with an address recognizable by the next switch, the cell will eventually get to the correct destination.

Most ATM switches, such as switches 212 and 214 shown in FIG. 2, perform cell switching based on a connection table contained within the switch. For each input port that receives an ATM cell, its address is matched to a corresponding entry in the connection table that contains a corresponding output port number and output address. That is, a connection table for each input port on the switch contains a series of addresses that are matched to each of the incoming ATM cell's header addresses. A corresponding entry in the table contains an output port and output address. The output address is inserted into the ATM header, and the ATM cell is then output from the output port of the ATM switch. Thus, to provide full 28 bit addressing capability for an NNI link, the table must have $2^{28}$ entries. Most switches, however, use smaller connection tables.

FIG. 3 schematically illustrates such a connection table 300. Connection table 300 includes a section for each input port of the ATM switch. For example, a first section 310 corresponds to a first input port of the ATM switch; a second section 320 corresponds to a second input port; a third section 330 corresponds to a third input port; and so on to a section 340 corresponding to any arbitrary input port contained within the ATM switch. For each input port, a plurality of input addresses 312 are stored within connection table 300. For each input address 312, a corresponding output port and output address 314 are also stored within connection table 300. Thus, for the first section 310 corresponding to a first input port of the ATM switch, multiple input addresses 312, each having a corresponding output port and address 314, are stored within connection table 300. Thus, in operation, the ATM switch compares the input address of an incoming ATM cell to the portion of the connection table 300 corresponding to the input port on which the cell was received. When a matching input address is found, the ATM switch then routes the cell to the output port and address listed in connection table 300 that corresponds to the matching input address.

From the above, it will be apparent that bit errors occurring during transmission of an ATM cell can occur in either a header portion 102, a payload portion 104 or in both sections. When such errors occur in header portion 102 and more particularly in the header address 120 or 122, the ATM cell will likely not be routed to the correct destination. Specifically, if header address 120 or 122 of an ATM cell experience one or more uncorrected bit errors, then an ATM switch receiving the ATM cell will not find a match between the incoming header address and the input addresses stored within the connection table of the ATM switch. Thus, the switch will not be able to correctly route the ATM cell to the proper output port and address. Thus, the ATM cell will not reach its desired destination.

The often utilized method of applying bandwidth-costly forward-error-correction, or FEC, techniques to protect against such bit errors has serious drawbacks. One of the most serious drawbacks results because the use of FEC generally provides for error correction for an entire ATM link, including noise tolerant traffic, such as voice, that does not need to be protected from errors to the same degree as noise intolerant traffic, such as digital data, thus wasting precious bandwidth. A preferred solution then, must permit FEC (or realize the benefits from FEC) on a per virtual circuit basis. In other words, FEC should be applied only to selected noise sensitive traffic in a given link. Since virtual circuits in an ATM link are identified by the header address 120 or 122, an error tolerant addressing scheme is required to (a) identify the specific cells that require FEC, and (b) to correctly route those cells through a noisy link. Moreover, even voice traffic, where the payload portion 104 does not require FEC, will need some protection of the ATM cell header information in order to reduce misrouting of the cells.

SUMMARY OF THE INVENTION

In view of the forgoing, it is an object of the present invention to provide a system and method for reliably transferring information through a noisy transmission link or a transmission link having a high bit error rate.

It is another object of the present invention to provide a system and method for transferring information using an ATM compatible data format through a wireless or satellite transmission path that is susceptible to high data error rates.

It is another object of the present invention to provide a system and method of configuring a connection table of an ATM switch to facilitate transmission of information through a noisy transmission link or a transmission link having a high bit error rate.

It is a still further object of the present invention to provide a system and method for transmitting digital information through an ATM data transmission system in which multiple redundant addressing information is stored within a connection table of an ATM switch in the data transmission system.

It is a still further object of the present invention to provide a system and method for configuring a connection table of an ATM switch to include a plurality of different input ATM header addresses corresponding to the same output port and address to thereby provide multiple redundant addressing.

It is yet another object of the present invention to provide an error tolerant addressing system and method, including multiple redundancy addressing, that requires no special hardware and no modifications to the current ATM data formatting standard.

It is a still further object of the present invention to provide a system and method for generating a plurality of principal header addresses used for transferring ATM cells through an ATM compatible network.

It is yet another object of the present invention to provide a method of configuring a connection table of an ATM switch to reduce or eliminate misrouting of ATM cells that results from bit errors occurring in a header address of the ATM cells.

DETAILED DESCRIPTION OF THE PREFERRED EMBODIMENT

In order to overcome the above disadvantages, the present invention provides a multiple redundancy addressing system and method to reduce or eliminate misrouting of ATM cells due to bit errors occurring within the header address of the ATM cell. The multiple redundancy system and method of the present invention includes the provision of multiple virtual circuits leading to the same destination. The addresses for the virtual circuits are within an error space of the principal virtual circuit used for actual transmission. Thus, the most probable error patterns occurring in the header address field will simply change the address to another valid address leading to the same destination. For example, if a local postman cannot distinguish between the numerals 9 and 4, only 50% of the mail destined for a street address of 129 will be correctly delivered. You can, however, ensure delivery by claiming both 124 and 129 as your address. The drawback, of course, is that no one else can use address 124.

Figure 1A:
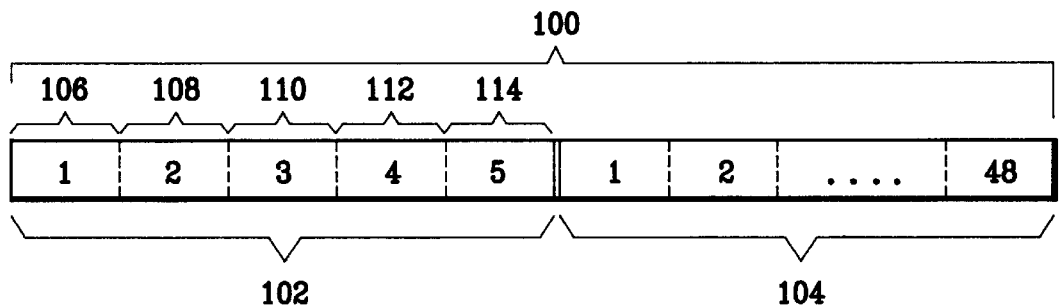
FIG. 1A is a schematic diagram of a typical ATM cell.
Figure 1B:
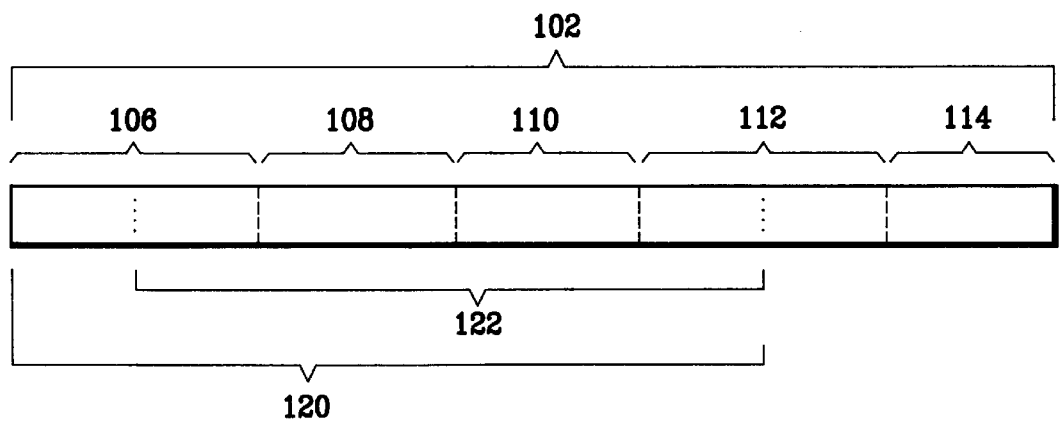
FIG. 1B is a schematic diagram illustrating in more detail a header portion of the ATM cell shown in FIG. 1A.
Figure 2:
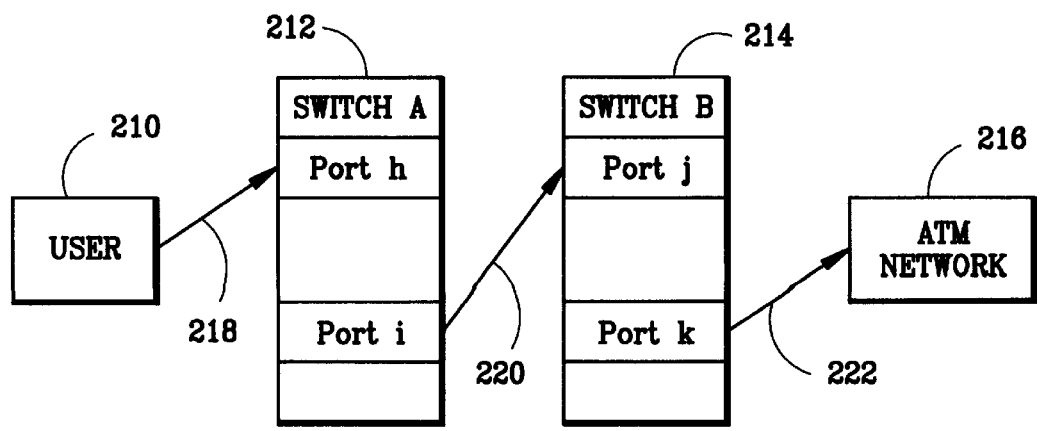
FIG. 2 is schematically illustrates a conventional ATM cell switching method.
Figure 3:
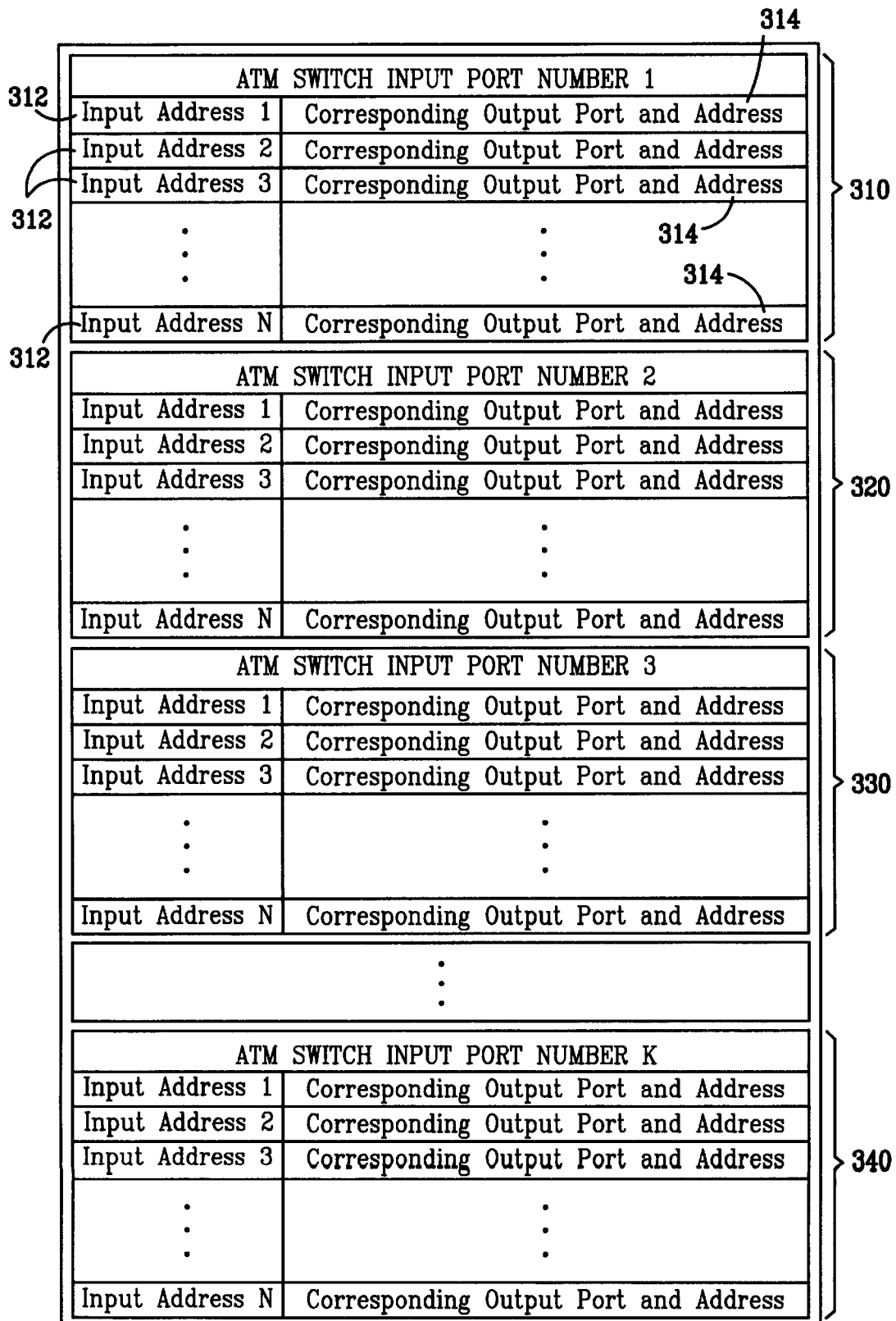
FIG. 3 schematically illustrates a connection table used within an ATM switch in accordance with the present invention.

A more direct example is made with reference to FIG. 2, where the address discussed below are given in binary form with a colon separating every four bits to facilitate reading of the addresses. In this example, link 220 is noisy, and switch A 212 and switch B 214 have agreed that some important data shall be sent from switch 212 A to switch B 214 using a 24 bit principal address of 0000:0000:0000:0000:0000:0000. Subsequently, switch B 214 is to route these cells to port k and retransmit them on link 22 with a new output address of 1111: 1111:0000:0000: 1111:1111. To tolerate a single bit error in any one of the 24 possible principal address bits, switch B 214 must setup 24 redundant input addresses, in addition to the principal one, all pointing to the same output port k and the same output address of 1111:1111:0000:0000:1111:1111.

Figure 4:
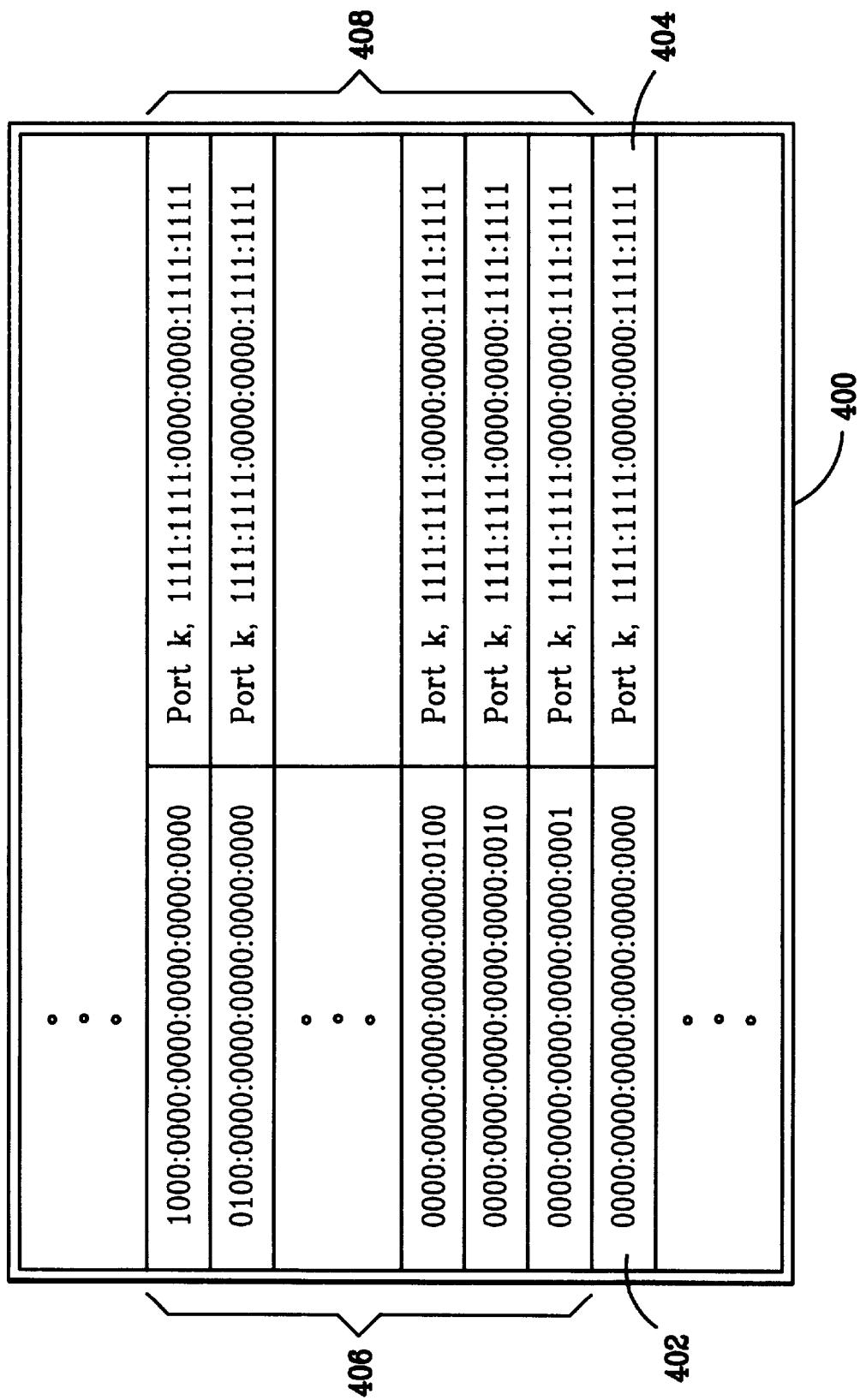
FIG. 4 shows a portion of the connection table shown in FIG. 3 illustrating the redundant addressing feature of the present invention.

A portion of a connection table for switch B 214 illustrating this redundant addressing is shown in FIG. 4. As seen in FIG. 4, connection table 400 includes principal input address 402 and a corresponding output port and address 404. In addition, 24 redundant input addresses shown generally at 406, each differing from principal input address 402 by 1 bit, also include identical output ports and addresses shown generally at 408. Thus, any single bit error occurring in principal input address 402 will result in an input address matching on of redundant input addresses 406. Therefore, due to the provision of corresponding redundant output ports and addresses 408, any single bit error occurring in principal input address 402 will not affect the output of the ATM cell to the proper port and address.

Clearly, in order to achieve proper routing of the ATM cell in accordance with the present invention, the principal and redundant addresses of one virtual circuit must all be distinct from the principal and redundant addresses of another virtual circuit. This puts restrictions on the selection of principal addresses. For the previous example, the principal addresses must differ from each other by at least 3 bits. If this condition is not met, for example, if another virtual circuit uses principal address 0000:0000:0000:0000:0000:0011, one of its redundant addresses will be 0000:0000:0000:0000:0000:0001, which is already claimed as a redundant address by the virtual circuit having 0000:0000:0000:0000:0000:0000 as a principal address. In general, a higher degree of error tolerance requires a larger number of redundant addresses and thus greater distinction between starting principal addresses. It will be apparent that in order to correct for t bit errors in the address, it is necessary that the multiple principal addresses differ from each other by at least 2t+1 bits in order to avoid any possible overlap of redundant addresses. Thus, a preferred embodiment of the present invention includes the generation of a set of principal addresses sufficiently distinct from each other such that none of their redundant addresses overlap. These principal addresses must be agreed upon by both ends of a noisy ATM link.

To generate the principal addresses in accordance with the present invention, the techniques and principles employed in a standard FEC coding scheme can be used. Typically, FEC techniques encode a k-bit message into an n-bit code word (where n > k) by adding j (=n−k) parity bits to the original message. Depending on the encoding technique, the code word can be subjected to varying sizes and types of errors (including burst or random) and yet the decoder can still correct the errors and recover the original message. An FEC scheme capable of correcting for t random error bits will generate code words that are distinct from one another by at least 2t +1 bits. Since this corresponds to the number of dissimilar bits required to ensure that redundant addresses do not overlap with each other as described above, these code words can be used as principal addresses in accordance with the present invention. Furthermore, by use of FEC techniques, the principal addresses can be pre-generated outside of the ATM switch.

There is a one-to-one correspondence between correctable errors for an FEC coded word and the maximum error tolerance for the multiple redundancy addressing system and method of the present invention. In other words, if an FEC scheme can correct t random bit errors, then by using the present invention can also al addresses, the multiple present invention can also tolerate up to t bit errors. Of course, redundant addresses must be generated from all the error patterns possible with t or fewer bits and stored within the connection tables of the ATM switches. In practice, the actual amount of error tolerance is generally governed by the maximum connection table size.

The Reed Solomon FEC code is particularly well suited for use in the present invention because it makes efficient use of the parity bits, is tolerant of cluster type errors (which are common in a wireless environment), and can be easily adopted to generate code word lengths of both 24 and 28 bits. Instead of correcting for bit errors, the Reed-Solomon FEC code corrects for symbol errors, where each symbol may include a group of bits. In the preferred embodiment of the present invention, 4 bit nibbles are used as symbols. The level of error tolerance can be chosen as 1 or 2 nibbles. To achieve 2 nibbles of error tolerance, the FEC encoder generates 4 nibbles (16 bits) of parity. Thus, for 24 bit principal address generation, a 2 nibble generating message is used and 4 nibbles of parity are added to result in a principal address having 6 nibbles, or 24 bits. The 2 nibble generating message can have any value from 0 to 255 decimal, thus resulting in 256 different possible principal addresses. For NNI links that use up to 28 bits of address, a 3 nibble generating message having a value from 0 to 4095 decimal is used, producing 4096 possible principal addresses. Similarly, for 1 nibble of error tolerance, only 2 nibbles of parity are needed. Thus, for 24 bit principal address generation, a 4 nibble generating message (0-65535 decimal) is used and 2 nibbles of parity are added to result in a principal address having 6 nibbles, or 24 bits. For NNI links that use up to 28 bits of address, a 5 nibble generating message having a value from 0 to 1,048,575 decimal is used, producing 1,048,576 possible principal addresses.

Few FEC codes have a natural code length n of 24 bits or 28 bits. For code words less than 24 bits (for UNI links) or 28 bits (for NNI links), the principal addresses can still be formed by adding a predetermined bit pattern, such a 0's, to the FEC generated code words. The receiving switch can then simply force the added bits to the predetermined pattern for each input cell, thus guaranteeing that no errors occur in these bits. The use of these FEC codes is disadvantageous, however, due to this extra process required at the receiving switch and due to the fact that a reduced number of possible usable principal addresses occurs as a result of using less than the total number of address bits. For FEC codes that generate code words with a natural length greater than 24 or 28 bits, standard code shortening techniques can be used to reduce the code word to 24 or 28 bits.

Figure 5:
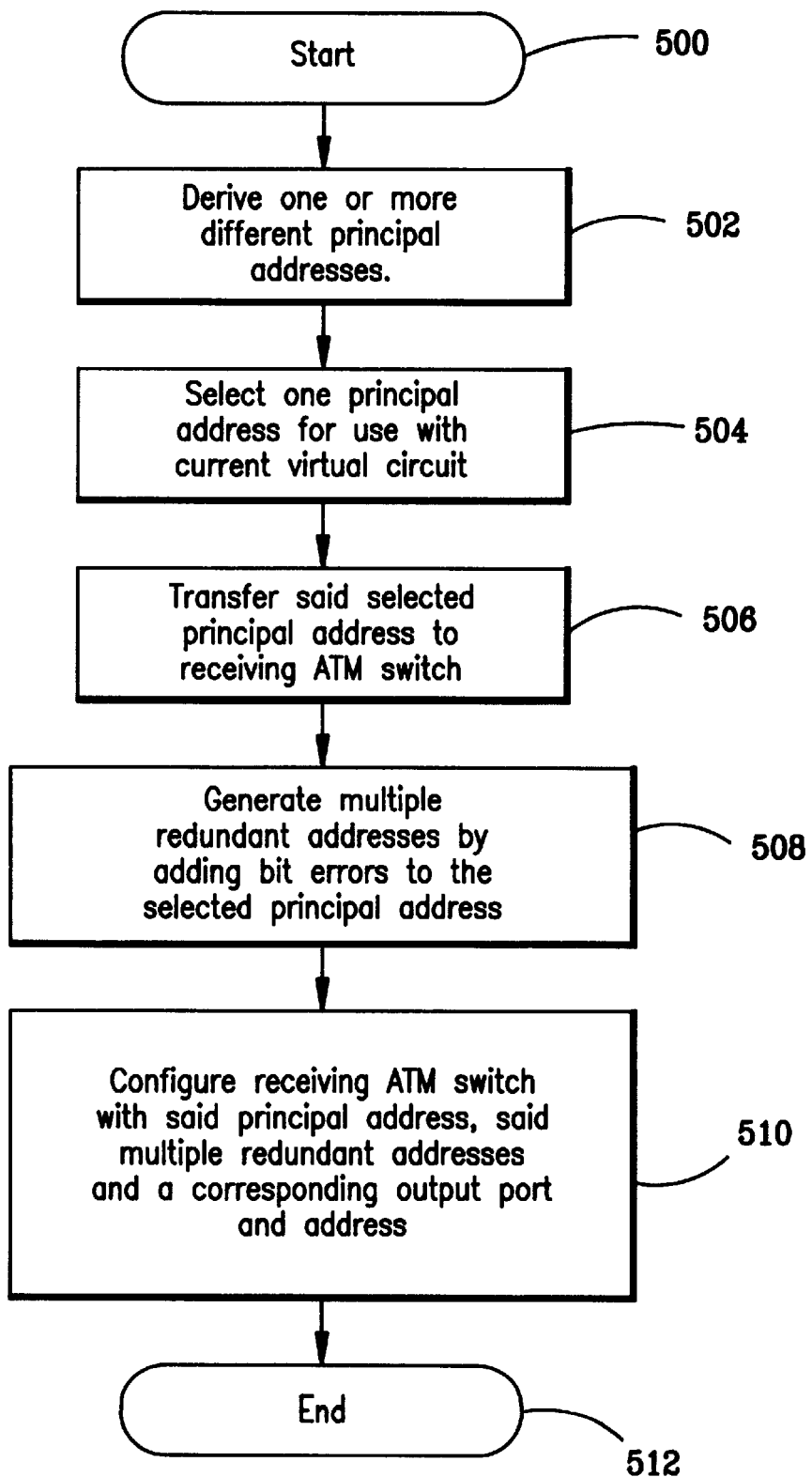
FIG. 5 is a flowchart illustrating a method for configuring a connection table in an ATM switch in accordance with the present invention.

Referring next to FIG. 5, a method of configuring a connection table in an ATM switch to facilitate transmission of ATM cells through a noisy transmission link in accordance with the present invention will now be described in more detail. When the method begins 500, the first step 502 is to derive one or more different principal addresses using the techniques discussed above. Specifically, in the most preferred embodiment, an FEC encoder is used to generate a plurality of FEC codes words to be used as the principal addresses. The second step 504 is to select one principal address for use with the current virtual circuit. This principal address is used during virtual circuit setup to designate the transmission path for ATM cells through the communications network. The next step 506 is to transfer the selected principal address to an ATM switch at a receiving end of the transmission network. Thus, both the transmitting and receiving ATM switches have agreed on the principal address to be used for the virtual circuit. The next step 508 is to generate a plurality of redundant addresses by adding bit errors to the selected principal address. That is, multiple redundant addresses are generated by systematically changing the state of bits in the principal address to simulate bit errors that could result during transmission through the ATM circuit. The next step 510 is to configure the ATM receiving switch with both the principal address and the multiple redundant addresses. Typically, a connection table within the switch is programmed with these addresses, and with a corresponding output port and address as discussed in detail above. The receiving switch is then configured to receive ATM cells through the noisy transmission link. The process then ends 512.

Although the invention has been described with reference to specific embodiments, various modifications of the disclosed embodiments as well as other embodiments of the invention will become apparent to persons skilled in the art on reference to the detailed description of the invention contained herein. Accordingly, the claims of the present application should not be limited to the specific preferred embodiments described.

We claim:

1. A method of increasing the error tolerance of an ATM virtual circuit that includes a transmission link susceptible to introducing bit errors during transmission of an ATM cell, comprising the steps of:

deriving a plurality of principal addresses comprising a plurality of bits, each of said plurality of principal addresses remaining distinguishable from each other in the event that one or more bit errors occur during transmission through the transmission link;

selecting, during virtual circuit connection set-up and at an ATM switch on the transmitting end of the transmission link, one of said plurality of principal addresses for use in transferring information through the transmission link;

transferring said one of said plurality of principal addresses to an ATM switch on the receiving end of the transmission link;

configuring a connection table in said ATM switch on the receiving end of the transmission link to route ATM cells having said one of said plurality of principal addresses to a designated output port and output address; and configuring said connection table in said ATM switch on the receiving end of the transmission link to include multiple redundant input address entries and a corresponding output port and output address identical to said designated output port and output address, each of said multiple redundant input address entries being generated by adding bit errors to said one of said plurality of principal addresses.

2. The method of claim 1 wherein said plurality of principal addresses comprise a plurality of FEC code words, each of said plurality of code words being generated from an input message using an FEC encoder.

3. The method of claim 2 wherein said plurality of FEC code words are generated using a Reed-Solomon FEC coding method using symbols comprising 4 bit nibbles.

4. The method of claim 3 wherein the transmission link comprises an ATM network-network interface, said plurality of principal addresses each comprise 28 bits, said input message comprises 3 nibbles and said Reed-Solomon FEC coding method adds 4 nibbles of parity to said 3 nibbles to generate each of said plurality of principal addresses.

5. The method of claim 3 wherein the transmission link comprises an ATM network-network interface, said plurality of principal addresses each comprise 28 bits, said input message comprises 5 nibbles and said Reed-Solomon FEC coding method adds 2 nibbles of parity to said 5 nibbles to generate each of said plurality of principal addresses.

6. The method of claim 3 wherein the transmission link comprises an ATM user network interface, said plurality of principal addresses each comprise 24 bits, said input message comprises 2 nibbles and said Reed-Solomon FEC coding method adds 4 nibbles of parity to said 2 nibbles to generate each of said plurality of principal addresses.

7. The method of claim 3 wherein the transmission link comprises an ATM user-network interface, said plurality of principal addresses each comprise 24 bits, said input message comprises 4 nibbles and said Reed-Solomon FEC coding method adds 2 nibbles of parity to said 4 nibbles to generate each of said plurality of principal addresses.

8. A method of controlling an ATM switch to facilitate transfer of a plurality of ATM cells having a header portion containing an address through a communications system susceptible to introducing bit errors during transmission of the ATM cells comprising the steps of:
  generating a principal input address;
  generating a plurality of redundant input address differing from said principal address by one or more bits corresponding to the possible bit errors that may occur during the transmission of the ATM cells;
  generating an output address designating a destination for the plurality of ATM cells;
  storing said principal input address and said plurality of redundant input addresses into an input address portion of a connection table of the ATM switch, and storing said output address into an output address portion of said connection table corresponding to said input address portion, whereby the ATM switch transfers ATM cells having an address matching one of said principal input address and said redundant input addresses to said output address.

9. A method of controlling an ATM switch to facilitate transfer of a plurality of ATM cells having a header portion containing an address through a communications system susceptible to introducing bit errors during transmission of the ATM cells comprising the steps of:
  generating a principal input address and a plurality of redundant input addresses differing from said principal address by one or more bits;
  generating an output address designating a destination for the plurality of ATM cells;
  storing said principal input address and said plurality of redundant input addresses into an input address portion of a connection table of the ATM switch, and storing said output address into an output address portion of said connection table corresponding to said input address portion, whereby ATM switch transfers ATM cells having an address matching one of said principal input address and said redundant input addresses to said output address, wherein said principal input address comprises an FEC code word.

10. The method of claim 9 wherein said principal input address is generated from an input message using an FEC encoder.

11. The method of claim 9 wherein said FEC code word is generated from an input message using a Reed-Solomon FEC coding method using symbols comprising 4 bit nibbles.

12. The method of claim 11 wherein the communications system comprises an ATM network-network interface, said principal input address comprises 28 bits, said input message comprises 3 nibbles and said Reed-Solomon FEC coding method adds 4 nibbles of parity to said 3 nibbles to generate said principal input address.

13. The method of claim 11 wherein the communications system comprises an ATM network-network interface, said principal input address comprises 28 bits, said input message comprises 5 nibbles and said Reed-Solomon FEC coding method adds 2 nibbles of parity to said 5 nibbles to generate said principal input address.

14. The method of claim 11 wherein the communications system comprises an ATM user-network interface, said principal input address comprises 24 bits, said input message comprises 2 nibbles and said Reed-Solomon FEC coding method adds 4 nibbles of parity to said 2 nibbles to generate said principal input address.

15. The method of claim 11 wherein the communications system comprises an ATM user-network interface, said principal input address comprises 24 bits, said input message comprises 4 nibbles and said Reed-Solomon FEC coding method adds 2 nibbles of parity to said 4 nibbles to generate said principal input address.

16. An ATM switch for use in transferring a plurality of ATM cells having a header portion containing an address through a communications system susceptible to introducing bit errors during transmission of the ATM cells, said ATM switch comprising: a memory containing a connection table, said connection table including an input address portion storing a principal input address and a plurality of redundant input addresses differing from said principal address by one or more bits corresponding to the possible bit errors that may occur during the transmission of the ATM cells, and an output address portion corresponding to said input address portion storing an output address designating a destination for the plurality of ATM cells.

17. An ATM switch for use in transferring a plurality of ATM cells having a header portion containing an address through a communications system susceptible to introducing bit errors during transmission of the ATM cells comprising a memory containing a connection table, said connection table including an input address portion storing a principal input address and a plurality of redundant input addresses differing from said principal address by one or more bits, and an output address portion corresponding to said input address portion storing an output address designating a destination for the plurality of ATM cells, wherein said principal input address comprises an FEC code word generated from an input message using an FEC encoder.

18. The ATM switch of claim 17 wherein said FEC code word is generated using a Reed-Solomon FEC coding method using symbols comprising 4 bit nibbles.

19. The ATM switch of claim 18 wherein the communications system comprises an ATM network-network interface, said principal address comprises 28 bits, said input message comprises 3 nibbles and said Reed-Solomon FEC coding method adds 4 nibbles of parity to said 3 nibbles to generate said principal address.

20. The ATM switch of claim 18 wherein the communications system comprises an ATM network-network interface, said principal address comprises 28 bits, said input message comprises 5 nibbles and said Reed-Solomon FEC coding method adds 2 nibbles of parity to said 5 nibbles to generate said principal address.

21. The ATM switch of claim 18 wherein the communications system comprises an ATM user-network interface, said principal address comprises 24 bits, said input message comprises 2 nibbles and said Reed-Solomon FEC coding method adds 4 nibbles of parity to said 2 nibbles to generate said principal address.

22. The ATM switch of claim 18 wherein the communications system comprises an ATM user-network interface, said principal address comprises 24 bits, said input message comprises 4 nibbles and said Reed-Solomon FEC coding method adds 2 nibbles of parity to said 4 nibbles to generate said principal address.

* * * * *